(12) United States Patent
Singletary et al.

(10) Patent No.: US 11,911,954 B2
(45) Date of Patent: Feb. 27, 2024

(54) METHOD FOR MANUFACTURING A THREE-DIMENSIONAL OBJECT

(71) Applicant: SOLVAY SPECIALTY POLYMERS USA, LLC, Alpharetta, GA (US)

(72) Inventors: Nancy J. Singletary, Alpharetta, GA (US); Stéphane Jeol, Cumming, GA (US)

(73) Assignee: SOLVAY SPECIALTY POLYMERS USA, LLC, Alpharetta, GA (US)

( * ) Notice: Subject to any disclaimer, the term of this patent is extended or adjusted under 35 U.S.C. 154(b) by 505 days.

(21) Appl. No.: 16/088,926

(22) PCT Filed: Mar. 27, 2017

(86) PCT No.: PCT/EP2017/057198
§ 371 (c)(1),
(2) Date: Sep. 27, 2018

(87) PCT Pub. No.: WO2017/167691
PCT Pub. Date: Oct. 5, 2017

(65) Prior Publication Data
US 2020/0324457 A1 Oct. 15, 2020

Related U.S. Application Data

(60) Provisional application No. 62/316,835, filed on Apr. 1, 2016.

(51) Int. Cl.
| | |
|---|---|
| *B29C 64/00* | (2017.01) |
| *B29C 64/118* | (2017.01) |
| *B29C 64/321* | (2017.01) |
| *B29C 64/364* | (2017.01) |
| *B29C 64/232* | (2017.01) |
| *B29C 64/245* | (2017.01) |
| *B29C 64/295* | (2017.01) |
| *B29C 64/209* | (2017.01) |
| *B29C 64/236* | (2017.01) |
| *B29C 64/40* | (2017.01) |

(Continued)

(52) U.S. Cl.
CPC ...... *B29C 64/118* (2017.08); *B01D 67/00045* (2022.08); *B01D 67/00415* (2022.08); *B05D 5/083* (2013.01); *B22F 10/00* (2021.01); *B22F 10/85* (2021.01); *B22F 12/00* (2021.01); *B22F 12/82* (2021.01); *B29C 64/00* (2017.08); *B29C 64/10* (2017.08); *B29C 64/176* (2017.08); *B29C 64/182* (2017.08); *B29C 64/20* (2017.08); *B29C 64/205* (2017.08); *B29C 64/209* (2017.08); *B29C 64/227* (2017.08); *B29C 64/232* (2017.08); *B29C 64/236* (2017.08); *B29C 64/245* (2017.08); *B29C 64/25* (2017.08); *B29C 64/255* (2017.08); *B29C 64/295* (2017.08); *B29C 64/30* (2017.08); *B29C 64/307* (2017.08); *B29C 64/321* (2017.08); *B29C 64/364* (2017.08); *B29C 64/386* (2017.08); *B29C 64/393* (2017.08); *B29C 64/40* (2017.08); *B33Y 40/00* (2014.12); *B33Y 40/10* (2020.01); *B33Y 40/20* (2020.01); *B33Y 50/00* (2014.12); *B33Y 50/02* (2014.12); *B33Y 80/00* (2014.12); *B33Y 99/00* (2014.12); *B29K 2069/00* (2013.01); *B29K 2823/06* (2013.01); *B29K 2877/10* (2013.01); *B29K 2879/085* (2013.01); *B29K 2881/06* (2013.01); *B29K 2995/004* (2013.01); *B29K 2995/0062* (2013.01); *B33Y 10/00* (2014.12); *B33Y 30/00* (2014.12); *B33Y 70/00* (2014.12); *G03F 7/70416* (2013.01); *G03G 2215/2054* (2013.01); *G05B 2219/49023* (2013.01); *G05B 2219/49246* (2013.01); *H05K 2201/015* (2013.01); *Y10T 156/1722* (2015.01); *Y10T 156/1798* (2015.01)

(58) Field of Classification Search
CPC ........................... B29C 64/118; B29C 64/321
See application file for complete search history.

(56) References Cited

U.S. PATENT DOCUMENTS

| | | |
|---|---|---|
| 6,160,080 A | 12/2000 | Cucinella et al. |
| 6,525,166 B1 | 2/2003 | Di Silvestro et al. |

(Continued)

FOREIGN PATENT DOCUMENTS

| | | |
|---|---|---|
| CN | 105238041 A | 1/2016 |
| WO | 97/24388 A1 | 7/1997 |

(Continued)

OTHER PUBLICATIONS

Toray—https://www.toray.jp/plastics/en/amilan/technical/tec_003.html (Year: 2021).*
Extract from Wikipedia (polyamides) from Nov. 6, 2015 (Wayback Machine) (with English machine translation from Nov. 14, 2015)—20 pg.
Technical data sheet for Polyamide 6.6 extracted online on Nov. 2, 2020—including English machine translation—8 pg.
DSM Technical data sheet for Akulon® S223-HM8 PA66-MD40—May 23, 2014 (and in English from Apr. 1, 2016)—4 pg.

(Continued)

*Primary Examiner* — Nicholas R Krasnow
(74) *Attorney, Agent, or Firm* — Osha Bergman Watanabe & Burton LLP

(57) ABSTRACT

The invention pertains to a method for manufacturing a three-dimensional object with an additive manufacturing system, such as an extrusion-based additive manufacturing system, a selective laser sintering system, and/or an electrophotography-based additive manufacturing system, comprising providing a support material comprising more than 50% wt. of a semi-crystalline polyamide [polyamide (A)] having a melting point, as determined according to ASTM D3418, of at least 250° C. and possessing a water absorption at saturation, by immersion in water at 23° C., of at least 2% wt.

17 Claims, No Drawings

(51) Int. Cl.
*B22F 12/00* (2021.01)
*B05D 5/08* (2006.01)
*B29C 64/176* (2017.01)
*B33Y 99/00* (2015.01)
*B33Y 40/00* (2020.01)
*B29C 64/182* (2017.01)
*B33Y 40/20* (2020.01)
*B22F 10/00* (2021.01)
*B33Y 40/10* (2020.01)
*B29C 64/205* (2017.01)
*B29C 64/20* (2017.01)
*B22F 10/85* (2021.01)
*B29C 64/10* (2017.01)
*B29C 64/227* (2017.01)
*B29C 64/25* (2017.01)
*B29C 64/30* (2017.01)
*B33Y 50/02* (2015.01)
*B01D 67/00* (2006.01)
*B29C 64/255* (2017.01)
*B33Y 50/00* (2015.01)
*B29C 64/307* (2017.01)
*B22F 12/82* (2021.01)
*B33Y 80/00* (2015.01)
*B29C 64/386* (2017.01)
*B29C 64/393* (2017.01)
*B33Y 10/00* (2015.01)
*B33Y 30/00* (2015.01)
*B33Y 70/00* (2020.01)
*B29K 69/00* (2006.01)
*G03F 7/00* (2006.01)

(56) References Cited

U.S. PATENT DOCUMENTS

| | | | | |
|---|---|---|---|---|
| 6,830,643 B1* | 12/2004 | Hayes | ............... | B41M 3/006 |
| | | | | 156/241 |
| 10,264,995 B2* | 4/2019 | Brister | ............... | A61B 5/065 |
| 10,350,100 B2* | 7/2019 | Nelson | ............... | A61B 90/39 |
| 2001/0025073 A1 | 9/2001 | Lombardi et al. | | |
| 2002/0017743 A1 | 2/2002 | Priedeman, Jr. | | |
| 2003/0004600 A1* | 1/2003 | Priedeman, Jr. | ......... | G16Z 99/00 |
| | | | | 700/119 |
| 2004/0062888 A1* | 4/2004 | Cruz | ............... | A22C 13/0013 |
| | | | | 428/34.8 |
| 2010/0152328 A1* | 6/2010 | Tseng | ............... | C08L 77/06 |
| | | | | 523/351 |
| 2010/0244333 A1 | 9/2010 | Bedal et al. | | |
| 2011/0293918 A1 | 12/2011 | Lucas et al. | | |
| 2012/0070619 A1 | 3/2012 | Mikulak et al. | | |
| 2014/0141166 A1* | 5/2014 | Rodgers | ............... | C08L 77/06 |
| | | | | 427/256 |
| 2014/0141168 A1* | 5/2014 | Rodgers | ............... | B33Y 10/00 |
| | | | | 427/265 |
| 2015/0028523 A1 | 1/2015 | Jaker et al. | | |
| 2015/0145168 A1 | 5/2015 | Rodgers et al. | | |
| 2016/0068678 A1 | 3/2016 | Luo et al. | | |
| 2016/0152784 A1 | 6/2016 | Fillot et al. | | |
| 2017/0252981 A1* | 9/2017 | Li | ............... | B29C 64/40 |
| 2017/0253702 A1* | 9/2017 | Ma | ............... | C08J 3/215 |
| 2018/0111337 A1* | 4/2018 | Demuth | ............... | B29C 64/118 |
| 2018/0370121 A1* | 12/2018 | Demuth | ............... | B33Y 70/00 |
| 2019/0160732 A1* | 5/2019 | Hirai | ............... | B33Y 70/00 |

FOREIGN PATENT DOCUMENTS

| | | | | |
|---|---|---|---|---|
| WO | 99/60508 A1 | 11/1999 | | |
| WO | 99/64496 A1 | 12/1999 | | |
| WO | WO 2001089814 A1 | 11/2001 | | |
| WO | 2010/112602 A1 | 10/2010 | | |
| WO | 2013/007128 A1 | 1/2013 | | |
| WO | WO-2014012240 A1 * | 1/2014 | ......... | B29C 45/0001 |
| WO | 2015/007918 A1 | 1/2015 | | |
| WO | 2015/012862 A1 | 1/2015 | | |
| WO | 2017/167691 A1 | 10/2017 | | |

OTHER PUBLICATIONS

RD 513013 "Use of Polyamide-46 in selective laser sintering" published on Jan. 10, 2007, by DSM Engineering Plastics BV, Research Disclosure, vol. 513, Jan. 2007, p. 46—3 pg.

Stanyl® TQ300 data sheet from DSM Engineering Materials (polyamide 4.6) extracted online from https://www.kern.de on Nov. 12, 2020—2 pg.

Standard ASTM D3418, "Standard Test Method for Transition Temperatures and Enthalpies of Fusion and Crystallization of Polymers by Differential Scanning Calorimetry", 2008, p. 1-7.

Notice of Opposition to a European Patent issued in EP Patent No. 3436503 dated Feb. 9, 2020 (25 pages).

\* cited by examiner

METHOD FOR MANUFACTURING A THREE-DIMENSIONAL OBJECT

RELATED APPLICATION

This application claims priority to U.S. provisional application No. 62/316,835 filed on Apr. 1, 2016, the whole content of this application being incorporated herein by reference for all purposes.

TECHNICAL FIELD

The present disclosure relates to additive manufacturing systems for printing three-dimensional (3D) parts and support structures. In particular, the present disclosure relates to support materials for use in additive manufacturing systems, methods of using the support materials and assemblies in additive manufacturing systems to print 3D parts.

BACKGROUND ART

Additive manufacturing systems are used to print or otherwise build 3D parts from digital representations of the 3D parts using one or more additive manufacturing techniques. Examples of commercially available additive manufacturing techniques include extrusion-based techniques, jetting, selective laser sintering, powder/binder jetting, electron-beam melting, and stereolithography processes. For each of these techniques, the digital representation of the 3D part is initially sliced into multiple horizontal layers. For each sliced layer, a tool path is then generated, which provides instructions for the particular additive manufacturing system to print the given layer.

For example, in an extrusion-based additive manufacturing system, a 3D part may be printed from a digital representation of the 3D part in a layer-by-layer manner by extruding a flowable part material. The part material is extruded through an extrusion tip carried by a print head of the system, and is deposited as a sequence of roads on a platen in an x-y plane. The extruded part material fuses to previously deposited part material, and solidifies upon a drop in temperature. The position of the print head relative to the substrate is then incremented along a z-axis (perpendicular to the x-y plane), and the process is then repeated to form a 3D part resembling the digital representation. An example of extrusion-based additive manufacturing system starting from filaments is called Fused Filament Fabrication (FFF) or Fused Deposition Modeling (FDM).

In fabricating 3D parts by depositing layers of a part material, supporting layers or structures are typically built underneath overhanging portions or in cavities of 3D parts under construction, which are not supported by the part material itself. A support structure may be built utilizing the same deposition techniques by which the part material is deposited. The host computer generates additional geometry acting as a support structure for the overhanging or free-space segments of the 3D part being formed, and in some cases, for the sidewalls of the 3D part being formed. The support material adheres to the part material during fabrication, and is removable from the completed 3D part when the printing process is complete.

Generally, soluble/leachable materials are used as support materials, enabling hence dissolving the support parts from the final 3D part, once the same is built, so that a soak and rinse post-processing is effective in recovering the part.

Within this scenario, WO 99/60508 (STRATASYS, INC.) Nov. 25, 1999 discloses the use of poly(2-ethyl-2-oxazoline) materials of formula:

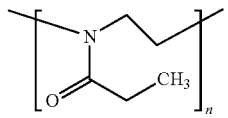

(PEO) as support materials for a fused filament forming technique, including removal thereof through soaking and rinsing. These PEO materials may be compounded with polyethylene glycol plasticizers, and plasticized formulations maybe further formulated notably with polyamides, in amounts not exceeding 35% wt., the said polyamides being possibly Nylon 12, and amorphous copolymers of terephthalic acid, isophthalamide and hexamethylenediamine, amorphous Nylon 6/Nylon 12 copolymer, and the like.

Similarly, US 20150028523 (STRATASYS, INC.) Jan. 29, 2015 discloses the use of a polyglycolic acid (PGA) support material for use in an additive manufacturing system, which can be removed by soaking in an aqueous medium. According to certain embodiment's, the PGA may comprise connected blocks of polyamide type, of aliphatic or aromatic type, in particular when to be used in association with polyamide part materials.

Nevertheless, choice of water-soluble polymers is relatively limited; water-soluble polymer compounds may be inadequate for supporting printing of certain polymers that require high processing temperatures, and in some cases soaking/rinsing detaching technique remains nevertheless quite burdensome, at least in that it requires post-treatment of significant amounts of waste waters, for disposal and/or recovering of water-soluble support polymer. In other cases, the use of soluble polymers as support material is the only way to generate hollow structures of the part material.

In fabricating 3D parts in association with high-temperature part materials, such as polysulfones, polyethersulfones, polyphenylsulfones, polyaryletherketones, polyetherimides, polyamideimides, polyphthalamides, polyphenylene sulfide and the like, support materials are required to provide vertical and/or lateral support in the higher operating conditions required for the high-temperature part materials, and shall not soften too much under the higher operating conditions: deformation would otherwise render them ineffective as support structure materials.

Nevertheless, there is a continuous quest for improved support materials simultaneously responding to the requirements for being used as support materials in additive manufacturing techniques, in particular in combination with high-temperature part materials, and which can be easily removed from the 3D shaped parts via easy techniques.

SUMMARY OF INVENTION

An aspect of the present disclosure is directed to a method for manufacturing a three-dimensional object with an additive manufacturing system, such as an extrusion-based additive manufacturing system, a selective laser sintering system, and/or an electrophotography-based additive manufacturing system, comprising providing a support material comprising more than 50% wt. of a semi-crystalline polyamide [polyamide (A)] having a melting point, as determined according to ASTM D3418, of at least 250° C.

and possessing a water uptake at saturation, by immersion in water at 23° C., of at least 2% wt.

The method also includes providing a part material, printing layers of a support structure from the provided support material, and printing layers of the three-dimensional object from the provided part material in coordination with the printing of the layers of the support structure, where at least a portion the printed layers of the support structure support the printed layers of the three-dimensional object.

The method further includes removing at least a portion of the support structure from the three-dimensional object so as to obtain the three-dimensional object.

The applicant has found that the selection of a support material predominantly composed of semi-crystalline polyamides possessing a melting temperature of at least 250° C. and possessing the water absorption behaviour, as stipulated above, is such to enable printing part materials from high-temperature engineering plastics requiring e.g. processing temperatures of 300° C. or beyond, and provides for support parts undergoing, upon exposure to moisture, sufficient swelling and deformation, to enable effective and prompt detaching from the printed part.

DESCRIPTION OF EMBODIMENTS

The expression 'polyamide' is hereby used according to its usual meaning, i.e. for designating polymers essentially composed of recurring units of any of formulaes:

  (I)

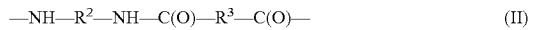  (II)

wherein $R^1$, $R^2$, $R^3$, equal to or different from each other, are divalent hydrocarbon chains, and may be aliphatic, alicyclic, cycloaliphatic, aromatic or combinations thereof, wherein $R^1$, $R^2$, $R^3$ may contain one or more than one heteroatom selected from the group consisting of O, N, S, P.

The recurring units (I) and (II) of the polyamide (A) are generally characterized by a number of carbon atoms in groups $R^1$, or $R^2$ and $R^3$ per amide group of advantageously less than 8.

Specifically, the polyamide (A) is a condensation product of at least one mixture selected from:
- mixtures (M1) comprising at least a diacid [acid (DA)] (or derivative thereof) and at least a diamine [amine (NN)] (or derivatives thereof);
- mixtures (M2) comprising at least a lactam [lactam (L)];
- mixtures (M3) comprising at least an aminocarboxylic acid [aminoacid (AN)]; and
- combinations thereof.

Acid (DA) derivatives include notably salts, anhydride, esters and acid halides, able to form amide groups; similarly, amine (NN) derivatives include notably salts thereof, equally able to form amide groups.

Said acid (DA) can be an aromatic dicarboxylic acid comprising two reactive carboxylic acid groups [acid (AR)] or an aliphatic dicarboxylic acid comprising two reactive carboxylic acid groups [acid (AL)]. For the purpose of the present invention, a dicarboxylic acid is considered as "aromatic" when it comprises one or more than one aromatic group.

Non limitative examples of acids (AR) are notably phthalic acids, including isophthalic acid (IA), and terephthalic acid (TA), 2,5-pyridinedicarboxylic acid, 2,4-pyridinedicarboxylic acid, 3,5-pyridinedicarboxylic acid, 2,2-bis(4-carboxyphenyl)propane, bis(4-carboxyphenyl)methane, 2,2-bis(4-carboxyphenyl)hexafluoropropane, 2,2-bis(4-carboxyphenyl)ketone, 4,4'-bis(4-carboxyphenyl)sulfone, 2,2-bis(3-carboxyphenyl)propane, bis(3-carboxyphenyl)methane, 2,2-bis(3-carboxyphenyl)hexafluoropropane, 2,2-bis(3-carboxyphenyl)ketone, bis(3-carboxyphenoxy)benzene, naphthalene dicarboxylic acids, including 2,6-naphthalene dicarboxylic acid, 2,7-naphthalene dicarboxylic acid, 1,4-naphthalene dicarboxylic acid, 2,3-naphthalene dicarboxylic acid, 1,8-naphthalene dicarboxylic acid and biphenyl-4,4'-dicarboxylic acid.

Among acids (AL), mention can be notably made of oxalic acid (HOOC—COOH), malonic acid (HOOC—$CH_2$—COOH), succinic acid [HOOC—$(CH_2)_2$—COOH], glutaric acid [HOOC—$(CH_2)_3$—COOH], 2,2-dimethyl-glutaric acid [HOOC—$C(CH_3)_2$—$(CH_2)_2$—COOH], adipic acid [HOO—$(CH_2)_4$—COOH], 2,4,4-trimethyl-adipic acid [HOOC—$CH(CH_3)$—$CH_2$—$C(CH_3)_2$—$CH_2$—COOH], pimelic acid [HOOC—$(CH_2)_5$—COOH], suberic acid [HOOC—$(CH_2)_6$—COOH], azelaic acid [HOOC—$(CH_2)_7$—COOH], sebacic acid [HOOC—$(CH_2)_8$—COOH], undecanedioic acid [HOOC—$(CH_2)_9$—COOH], dodecandioic acid [HOOC—$(CH_2)_{10}$—COOH], tridecanedioic acid [HOOC—$(CH_2)_{11}$—COOH], tetradecandioic acid [HOOC—$(CH_2)_{12}$—COOH], octadecandioic acid [HOOC—$(CH_2)_{16}$—COOH].

Yet, acids (AL) which can be used include cycloaliphatic-group containing acids, including notably 1,4-cyclohexane dicarboxylic acid, 1,3-cyclohexane dicarboxylic acids, as cis or trans diastereoisomers, possibly in admixture.

According to certain embodiments, acids (DA) comprising ionisable groups can be used [acids (IDA)] as polycondensation monomers of polyamide (A); among these ionisable groups, mention can be notably made of phenolic hydroxylic groups, sulfonic groups (generally aromatic sulfonic groups), phosphonic groups, onium goups (including phosphonium and ammonium groups) and the like. Non-limiting examples of acids (IDA) of this type which can be used within the frame of the present invention are notably 4-hydroxyisophthalic acid, 5-hydroxyisophthalic acid, 2-hydroxyterephthalic acid, 2,5-dihydroxyterephthalic acid, 4,6-dihydroxyisophthalic acid, 5-sulfoisophthalic acid (and salts thereof, e.g. Li, K, Na, Ag salts), and 2-sulfoterephthalic acid (and salts thereof, e.g. Li, K, Na, Ag salts).

Acids (IDA) including ionisable groups may be used in combination with acids (AR) and/or (AL), as above detailed.

The amine (NN) is generally selected from the group consisting of aliphatic diamines, aromatic diamines and mixtures thereof.

Said aliphatic diamines are typically aliphatic diamines having 2 to 18 carbon atoms.

Said aliphatic diamine is advantageously selected from the group consisting of 1,2-diaminoethane, 1,2-diaminopropane, propylene-1,3-diamine, 1,3-diaminobutane, 1,4-diaminobutane, 1,5-diaminopentane, 1,5-diamino-2-methylpentane, 1,4-diamino-1,1-dimethylbutane, 1,4-diamino-1-ethylbutane, 1,4-diamino-1,2-dimethylbutane, 1,4-diamino-1,3-dimethylbutane, 1,4-diamino-1,4-dimethylbutane, 1,4-diamino-2,3-dimethylbutane, 1,2-diamino-1-butylethane, 1,6-diaminohexane, 1,7-diaminoheptane, 1,8-diamino-octane, 1,6-diamino-2,5-dimethylhexane, 1,6-diamino-2,4-dimethylhexane, 1,6-diamino-3,3-dimethylhexane, 1,6-diamino-2,2-dimethylhexane, 1,9-diaminononane, 1,6-diamino-2,2,4-trimethylhexane, 1,6-diamino-2,4,4-trimethylhexane, 1,7-diamino-2,3-dimethylheptane, 1,7-diamino-2,4-dimethylheptane, 1,7-diamino-2,5-dimethylheptane, 1,7-diamino-2,2-dimethylheptane, 1,10-diaminodecane, 1,8-diamino-1,3-dimethyloctane, 1,8-diamino-1,4-dimethyloctane, 1,8-diamino-2,4- dimethyloctane, 1,8-diamino-3,4-dimethyloctane, 1.8-diamino-4,5-dimethyloctane, 1.8-diamino-2,2-dimethyloctane, 1.8-diamino-3,3-dimethyloctane, 1,8-diamino-4,4-dimethyloctane, 1,6-diamino-2,4-diethylhexane, 1,9-diamino-5-methylnonane, 1,11-diaminoundecane and 1,12-diaminododecane, 1,13-diaminotridecane, 2,5-bis(aminomethyl)tetrahydrofurane, N-methyl-bis-hexamethylene-triamine.

The aliphatic diamine preferably comprises at least one diamine selected from the group consisting of 1,6-diaminohexane, 1,8-diamino-octane, 1,10-diaminodecane, 1,12-diaminododecane and mixtures thereof. More preferably, the aliphatic alkylene diamine comprises at least one diamine selected from the group consisting of 1,6-diaminohexane, 1,10-diaminodecane and mixtures thereof. Even more preferably, the aliphatic alkylene diamine is 1,6-diaminohexane.

The aromatic diamine is preferably selected from the group consisting of meta-phenylene diamine, meta-xylylene diamine and para-xylylene diamine.

According to other embodiment's, at least one of the amine (NN) is a cycloaliphatic diamine, i.e. a diamine comprising a cycloaliphatic group [amine (cNN)]; the amine (cNN) is generally selected from the group consisting of isophoronediamine, bis(3,5-dialkyl-4-aminocyclohexyl) methane, bis(3,5-dialkyl-4-aminocyclohexyl)ethane, bis(3,5-dialkyl-4-aminocyclohexyl) propane, bis(3,5-dialkyl-4-aminocyclohexyl) butane, bis(3-methyl-4-aminocyclohexyl)methane, p-bis(aminocyclohexyl) methane, isopropylidenedi(cyclohexylamine), 4,4'-diamino-3,3'-dimethyldicyclohexylmethane, and 1,4-diaminocyclohexane.

According to certain other embodiments, at least one of the amine (NN) comprises ethereal bonds can be used [amine (NNE)] as polycondensation monomers of polyamide (A); exemplary embodiments of amine (NNE), otherwise referred to as polyetherdiamines are notably diamines comprising moieties of formula: $-(OCH_2-CHR^J)_n-$, with $R^J$ being H or a $C_1$-$C_3$ alkyl group, preferably $-CH_3$, and n being an integer of 1 to 15 and diamines comprising moieties of formula: $-O-C(R^{tJ})(R^{ttJ})-O-$, with $R^{tJ}$ and $R^{ttJ}$, equal to or different from each other and at each occurrence, being H or a $C_1$-$C_3$ alkyl group, preferably $-CH_3$.

Exemplary embodiments thereof are amines (NNE) of any of formulae:

1)

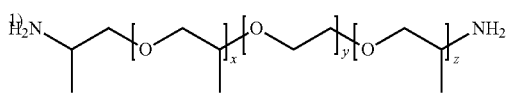

with x, and z being zero or integers, with y being an integer, with the provisio that x+y+z is an integer of 1 to 15;

2)

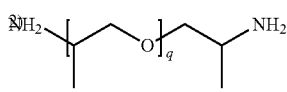

with q being an integer of 1 to 15;

3)

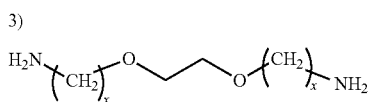

with each of x, equal to or different from each other, being an integer of 1 to 6;

4)

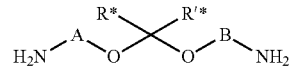

wherein R* and R'*, equal to or different from each other, are independently hydrogen, a $C_1$-$C_3$ alkyl group; A is alkyl, alkenyl, alkenene, alkylene-hetero-alkylene, alkylene-heterocyclo-alkylene, alkylene, alkylene-oxy-alkylene, 1,4-alkyl substituted piperazine, carbonyl, thiocarbonyl; B is alkyl, alkenyl, alkenene, alkylene-hetero-alkylene, alkylene-heterocyclo-alkylene, alkylene, alkylene-oxy-alkylene, 1,4-alkyl substituted piperazine, carbonyl, thiocarbonyl; R2 is hydrogen, alkyl, aminoalkyl, alkyl-amino-alkyl, cycloalkyl, heterocycloalkyl, alkenyl, aryl, or heteroaryl; amines complying with this structural formula are notably disclosed in WO 2013/007128 (ADESSO ADVANCED MATERIALS WUXI CO. LTD.) Jan. 17, 2013.

Generally, the molecular weight of the preferred amines (NNE) will be of at most 400, more preferably at least 200, even more preferably at most 150 g/mol. Amines (NNE), as detailed above, are notably available under trade name Jeffamine or Elastamine from Huntsmann Chemicals. Specific examples thereof include notably 2,2'-oxydiethanamine, 2,2'-(ethylenedioxy)bis(ethylamine), ethylene glycol bis(3-aminopropyl) ether.

Lactam (L) suitable for use for the manufacture of polyamide (A) can be any of β-lactam or ε-caprolactam, dodecanolactam.

Aminoacid (AN) suitable for use for the manufacture of polyamide (A) can be selected from the group consisting of 6-amino-haxanoic acid, 9-aminononanoic acid, 10-aminodecanoic acid, 11-aminoundecanoic acid, 12-aminododecanoic acid, 13-aminotridecanoic acid.

It is still within the scope of the invention the addition to any of mixtures (M1), (M2), (M3), and their combinations, of one or more than one polyfunctional acid/amine monomers comprising more that two carboxylic acid and amine groups, e.g. polycarboxylic acid having three or more carboxylic acid groups, polyamines having three or more amine groups, polyfunctional diacid including two carboxylic groups and one or more amine groups, polyfunctional diamine including two amine groups and one or more carboxylic acid groups. Incorporation of said polyfunctional acid/amine monomers generally lead to branched structures, star-like or tree-like, such as those notably described in WO 97/24388 (NYLTECH ITALIA) Oct. 7, 1997 and in WO 99/64496 (NYLTECH ITALIA) Dec. 16, 1999.

It is also further understood that one or more than one end capping agent [agent (M)] can be added to any of mixtures (M1), (M2), (M3), and their combinations for the manufacture of polyamide (A), without this departing from the scope of the invention. The agent (M) is generally selected from the group consisting of an acid comprising only one reactive carboxylic acid group [acid (MA)] and an amine comprising only one reactive amine group [agent (MN)].

Acid (MA) is preferably selected from the group consisting of acetic acid, propionic acid, butyric acid, valeric acid, caproic acid, caprylic acid, lauric acid, stearic acid, cyclohexanecarboxylic acid, benzoic acid, 3-sulfobenzoic acid (and salts thereof, e.g. Li, K, Na, Ag salts), 4-sulfobenzoic acid (and salts thereof, e.g. Li, K, Na, Ag salts), preferably from acetic acid and benzoic acid.

Amine (MN) is preferably selected from the group consisting of methylamine, ethylamine, butylamine, hexylamine, octylamine, benzylamine, aniline, toluidine.

One of ordinary skills in the art will select through routine experimentation mixtures (M1), (M2) or (M3), as detailed above, which are such to provide a polyamide (A), as above detailed, possessing the mentioned melting point and the mentioned water uptake behaviour.

Preferred mixtures (M1) are selected from:
(a) mixtures of 1,6-diaminohexane and adipic acid, that is to say resulting polycondensation product being a polyamide 66;
(b) mixtures of 1,4-diaminobutane and adipic acid, that is to say resulting polycondensation product being a polyamide 46;
(c) mixtures of 1,5-diaminopentane and and adipic acid, that is to say resulting polycondensation product being a polyamide 56;
(d) mixtures of adipic acid, terephthalic acid and 1,6-diaminohexane, wherein the amount of terephthalic acid is of at least 25% moles, with respect to the moles of the acid (DA);
(e) mixtures of terephthalic acid, isophthalic acid and 1,6-diaminohexane, wherein the amount of terephthalic acid is of at least 55% moles, with respect to the moles of the acid (DA);
(f) mixtures of adipic acid, terephthalic acid, isophthalic acid and 1,6-diaminohexane, wherein the amount of terephthalic acid is of at least 55% moles, with respect to the moles of the acid (DA);
(g) mixtures of terephthalic acid (possibly further comprising minor amounts, with respect to the acid (DA) of isophthalic acid and/or adipic acid) and at least one amine (NNE), as above detailed, possibly in combination with one or more than one aliphatic diamines, as above detailed;
(h) mixtures of adipic acid (possibly further comprising minor amounts, with respect to the acid (DA) of isophthalic acid and/or terephthalic acid) and at least one amine (NNE), as above detailed, possibly in combination with one or more than one aliphatic alkylene diamines, as above detailed;
(i) mixtures of adipic acid and at least one acid (IDA), as above described (preferably 5-sulfo-isophthalic acid, or salts thereof), said acid (IDA) representing at most 15%, preferably at most 10%, more preferably at most 5% moles of the total acid (DA) moles, and 1,6-diaminohexane;
(j) mixtures of terephthalic acid and at least one acid (IDA), as above described (preferably 5-sulfo-isophthalic acid, or salts thereof), said acid (IDA) representing at most 15%, preferably at most 10%, more preferably at most 5% moles of the total acid (DA) moles, and 1,6-diaminohexane;
(k) mixtures of 1,4-cyclohexanedicarboxylic acid (cis, trans or cis/trans mixtures) and at least one amine (NNE), as above detailed, possibly in combination with one or more than one aliphatic diamines, as above detailed;
(l) mixtures of 1,4-cyclohexanedicarboxylic acid (cis, trans or cis/trans mixtures) and at least one acid (IDA), as above described (preferably 5-sulfo-isophthalic acid, or salts thereof), said acid (IDA) representing at most 15%, preferably at most 10%, more preferably at most 5% moles of the total acid (DA) moles, and at least one amine (NNE), as above detailed, possibly in combination with one or more than one aliphatic diamines, as above detailed.

As detailed above, the water uptake at saturation, by immersion in water at 23° C., is of at least 2% wt, preferably of 5% wt of the polyamide (A). This water uptake can be determined by providing a specimen shaped according to ISO527 in its dry state (moisture content of less than 0.2% wt), immersing the same in deionized water at 23° C., until reaching a constant weight. The water uptake is calculated according to the formula:

$$\text{Water uptake} = \frac{W_{after} - W_{before}}{W_{before}} \times 100$$

wherein $W_{before}$ is the weight of the shaped specimen in its original dry state and $W_{after}$ is the weight of the shaped specimen after water uptake.

According to certain embodiments, the polyamide (A) is a polyamide which has solubility in water of at least 1% wt at a temperature of below 100° C. under atmospheric pressure.

The polyamide (A) of this embodiment has generally a solubility in mixtures of water and aliphatic alcohols (including notably methanol, ethanol, isopropanol, ethylene glycol) of at least 1% wt, preferably 5% wt at a temperature of below 100° C., under atmospheric pressure.

The soluble polyamide (A) of this embodiment is generally a polyamide prepared from a mixture (M1), as above detailed, wherein the said mixture (M1) comprises one or more than one amine (NNE), as detailed above. More specifically, the soluble polyamide (A) of this embodiment is advantageously selected from the group consisting of mixtures (g), (h), (i), (j), (k), (l), as defined above.

According to certain embodiments, the support material of the invention comprises at least one water-soluble polymeric additive different from polyamide (A). The choice of the polymeric additive is not particularly critical, provided that it has sufficient thermal stability to be admixed with the polyamide (A), and it is soluble in water, that is to say, possessing a solubility of at least 1% in water at a temperature of below 100° C. under atmospheric pressure. Polyelectrolytes such as polyacids (and their salts) and polyamines (and their salts), as well as non-ionizable polymers possessing water solubility can be advantageously used; this additive is generally selected from the group consisting of polyethyleneglycol (PEG) polymers; polyvinylpyrrolidone (PVP) polymers; polymethylenenaphthalene sulfonates (obtained by sulfonation of naphthalene, condensation with formaldehyde and neutralization) polymers; styrene sulfonate polymers having —$SO_3X_a$ groups, with $X_a$ being H or a metal, e.g. Na, K, Li, including polystyrene sulfonates and copolymers of styrene-co-styrene sulfonate; sulfonated sulfone polymers having —$SO_3X_a$ groups, with $X_a$ being H or a metal, including sulfonated polysulfones, sulfonated polyphenylsulfones, sulfonated polyethersulfones; polysuccinimides and salts; polyaspartic acids and salts; poly(meth)acrylic acids and salts (e.g. Na, K, Li); polyvinyl sulfonic acids and salts (e.g. Na, K, Li); polyvinylalcohols and the like.

When present, the said water soluble polymeric additive is added to the polyamide (A) in the support material in an amount of at least 1% wt, preferably at least 2% wt, more preferably at least 5% wt and/or generally of at most 30% wt, preferably at most 25% wt, more preferably at most 20% wt with respect to the total weight of support material.

Without being bound by this theory, the Applicant considers that the hydrophilic behaviour of the polyamide (A), possibly enhanced by the presence of the water soluble polymeric additive is effective for achieving sufficient detachment of the support material from the three dimensional object.

The support material of the invention may also include other additives different from the polyamide (A) and the water soluble polymeric additives; these additives are selected from those generally known for polyamides, and include notably fillers, colorants, plasticizers, stabilizers, and combinations thereof.

In embodiments that include fillers, preferred concentrations of the fillers in the support material range from 1% wt to 30% wt, with respect to the total weight of the support material. Suitable fillers include calcium carbonate, magnesium carbonate, glass fibers, graphite, carbon black, carbon fibers, talc, wollastonite, mica, alumina, silica, titanium dioxide, kaolin, silicon carbide, zirconium tungstate, and combinations thereof.

The support material of the present invention generally consists of:
from 55 to 100% wt of polyamide (A), as above detailed;
from 0 to 30% wt of water soluble polymeric additive, as above detailed; and
from 0 to 30% wt of other additives,
with respect to the total weight of the support material.

Preferably, the support material of the present invention advantageously consists of:
from 75 to 100% wt of polyamide (A), as above detailed;
from 0 to 20% wt of water soluble polymeric additive, as above detailed; and
from 0 to 20% wt of other additives, as above detailed, with respect to the total weight of the support material.

The support material of the present invention is used to print sacrificial support structures in additive manufacturing systems, such as extrusion-based additive manufacturing systems, and jetting-based additive manufacturing.

The support material is provided generally in a dry state; to this aim, the support material is generally dried prior to being delivered to and used in the additive manufacturing system.

As such, the support material provided to the additive manufacturing system preferably has a moisture content of less than 0.5% wt, preferably of less than 0.2% wt, with respect to the total weight of the support material. A preliminary drying step may be required to achieve this low moisture content by heating between 60 to 200 C the support material at atmospheric temperature (under air or nitrogen) or under vacuum for the desired amount of time.

The part material provided in the method of the present invention is generally a material requiring a processing temperature of at least 300° C. or beyond. Part materials which are generally associated in the method of the invention to the support material, as above detailed, are notably polysulfones, polyethersulfones, polyphenylsulfones, polyaryletherketones, including polyetheretherketone, polyetherimides, polyamideimides, polyphenylenesulfides, polyphenylenes, liquid crystal polymers, polycarbonates, aromatic and semi-aromatic polyamides, including notably metaxylylenediamine adipate (MXD6), and the like.

Generally, the step of printing layers of the three-dimensional object from the part material is hence carried out printing part material in the molten state at a temperature of at least 300° C., preferably at least 350° C.

According to certain preferred embodiment's, the method of the invention is a method for manufacturing a three-dimensional object with an extrusion-based additive manufacturing system, otherwise known also as fused filament fabrication technique.

The support material, according to these embodiment's, is provided under the form of a filament. The filament may have a cylindrical or substantially cylindrical geometry, or may have a non-cylindrical geometry, such as a ribbon filament geometry; further, filament may have a hollow geometry, or may have a core-shell geometry, with the support material of the present invention being used to form either the core or the shell.

Yet, the support material, according to these embodiment's may be also provided in powder form, e.g. for being fed through an auger-pump print head.

When the method is an extrusion-based additive manufacturing system, the step of printing layers of a sacrificial support structure from the provided support material comprises:
a) feeding the support material to a discharge head member having a throughbore ending with a discharge tip, and a circumferential heater to melt the material in the throughbore;
b) compressing the support material with a piston, for example with the unmelted filament acting as a piston, in said throughbore, while simultaneously melting the support material in the discharge head member, so as to extrude a ribbon of support material from the discharge tip; and
c) ensuring relative movement in x and y directions of the discharge tip and of a receiving platform while discharging support material on said receiving platform to form the cross sectional shape of the sacrificial support structure; and
d) ensuring relative movement in the z direction of the discharge tip and the receiving platform while discharging support material on said receiving platform to form the sacrificial support structure in elevation.

According to these embodiment's, the step of printing layers of the three-dimensional object from the provided part material in coordination with the printing of the layers of the sacrificial support structure, advantageously further comprises:
a') feeding the part material to a discharge head member having a throughbore ending with a discharge tip, and a circumferential heater to melt the material in the throughbore;
b') compressing the part material with a piston, for example with the unmelted filament acting as a piston, in said throughbore, while simultaneously melting the part material in the discharge head member, so as to extrude a ribbon of part material from the discharge tip; and
c) ensuring relative movement in x and y directions of the discharge tip and the receiving platform bearing the sacrificial support structure, while discharging support material on said receiving platform and said sacrificial support structure to form the cross sectional shape of the three-dimensional object, and d) ensuring relative movement in the z direction of the discharge tip and the receiving platform while discharging part material on said receiving platform and said sacrificial support structure, to form the three-dimensional object in elevation.

The method of the invention comprises a step of (iv) removing at least a portion of the sacrificial support structure from the assembly so as to obtain the three-dimensional object.

This method generally involves exposing the assembly to water vapour and/or to water.

When exposing to water in the liquid state, pure water can be used. Nevertheless, exposure to water solutions acidified or basified through the addition of acid(s) or base(s), to water mixtures with polar protic solvents (e.g. ethanol, isopropanol, ethylene glycol); to water solutions comprising electrolytes (e.g. sodium chloride, lithium chloride can be used. Generally water is present in the liquid medium used for this exposure in a concentration of at least 30% wt, preferably at least 50% wt.

This exposure can be realized in any manner.

According to certain embodiment's step (iv) includes exposing the assembly to moist air, e.g. to air possessing a relative humidity (RH) of at least 70%, preferably at least 80%, preferably at least 85%, at the temperature of exposure. This exposure to moist air can be effected at room temperature (i.e. at about 20-25° C.), but it is generally preferred to expose the assembly to moist air at a temperature of at least 50° C., preferably of at least 60° C. and/or generally at a temperature of at most 90° C., preferably of at most 80° C.

According to other embodiment's step (iv) includes contacting/immersing the assembly with/in water (i.e. liquid water). In this case, the water temperature for the immersing/contacting is generally about room temperature, i.e. temperatures of 20 to 25° C., although higher temperatures may equally be used, up to about 100° C.

The duration of exposure to water vapour and/or to water is not particularly limited, and exposure times of at least 1 hour may be effective.

It is nevertheless understood that when step (iv) comprises exposing the assembly to moist air, duration of exposure is preferably of at least 24 hours, preferably 30 hours.

As an outcome of step (iv), the sacrificial support structure is removed from the assembly; the said sacrificial support structure can be advantageously detached from the three-dimensional object and removed in its solid form. Nevertheless, for embodiment's wherein use is made of a polyamide (A) soluble in water, as above detailed, the removal of the sacrificial support structure can be achieved through at least partial solubilisation in water.

Should the disclosure of any patents, patent applications, and publications which are incorporated herein by reference conflict with the description of the present application to the extent that it may render a term unclear, the present description shall take precedence.

EXAMPLES

Raw Materials

A1. PolyPhenyleneSulfide (PPS) Fortron® 0317 having a $T_m=285°$ C. from Celanese, having a water uptake at saturation by immersion in water at 23° C. of 0.1% w.

A2. Polyglycolic acid (PGA) having a $T_m=220°$ C. synthesized according to the procedure described in WO 2010/112602 (SOLVAY S.A.) Oct. 7, 2010.

A3. Semi-crystalline polyphtalamide (PPA) Amodel® A-1004 (PA 6T/6I/66 65/25/10 mol/mol) having a $T_m=317°$ C. from Solvay. Water uptake at saturation by immersion in water at 23° C.: 6.5%.

A4. Semi-crystalline Polyphthalamide PA 9T having a $T_m=306°$ C. from Kuraray, Genestar™ 9T GC61010. Water uptake at saturation by immersion in water at 23° C.: 3%.

A5. Semi-crystalline copolyamide PA 66/6AlSNa 95/5 mol/mol synthesized according to the process in patent WO 2015/007918 example 3 having a $T_m=253°$ C. Water uptake at saturation by immersion in water at 23° C.: 12%.

A6. Semi-crystalline polyamide 66 (PA 66) Stabamid® 27 AE1 having a $T_m=260°$ C. from Solvay. Water uptake at saturation by immersion in water at 23° C.: 8%.

Additives

B1. Polyvinylpyrrolidone (PVP) 1,300 kDa purchased at Sigma-Aldrich

Sample Preparation

Support Material Test Shapes were Prepared by Several Different Methods.

E1. Plaques having a thickness of 2 mm (dimensions: length=7.5 cm; width=5 cm) of neat resin were prepared by injection molding.

E2. Film samples having a thickness above 100 micron were prepared by melt extrusion through a flat die without any stretching.

The compounds were prepared by melt extrusion using a twin-screw extruder with a melt temperature of 350° C.

The specific conditions for each compound are given in Table 1.

Testing

A molten filament of PolyEtherEtherKetone (PEEK) KetaSpire®KT-880 ($T_m=340°$ C.) was produced using a vertical extruder having a die of 0.8 mm diameter and heated at 400° C. (barrel temperature) and with a speed of 10 mm/s. At the exit of the die, the PEEK hot filament is put in contact with the film/plaque placed at a distance between of 1 mm from the die and a mono-layer film having a surface area of about 0.25 square inches is prepared. After the end of the printing process, the samples are left at room temperature to cool down.

The so-obtained printed assembly was examined to detect, notably, any melting/deformation phenomena of the support material and for testing the adhesion between support material and part material, and ability to detach/separate the support material and the part material. The following ranking was attributed:

0. The support material surface has completely melted at the surface during part material printing.
1. The support material surface has not melted nor shows any deformation evidence; significant cohesive force adheres the support material surface to the part material, so that detaching causes breaking/deterioration of the integrity of the support material and the part material, with residues of the support material adhered to the part material and vice-versa.
2. The support material surface has not melted nor shows any deformation evidence; there is no significant adhesion between the support material surface and the printed material, so that support material and part material can be separated using substantially no significant detaching force. Detaching leads to clean separation with no residues of support material on the part material and vice-versa.

TABLE 1

| | 1C | 2C | 3 | 4 | 5 | 6 | 7 |
|---|---|---|---|---|---|---|---|
| Support material - composition and shaped form | | | | | | | |
| A1 | 100 | | | | | | |
| A2 | | 100 | | | | | |
| A3 | | | 100 | | | | |
| A4 | | | | 100 | 80 | | |
| A5 | | | | | | 100 | |
| A6 | | | | | | | 100 |
| B1 | | | | | 20 | | |
| Shaped form | film | film | film | film | film | film | film |
| Behaviour upon printing part material | | | | | | | |
| Qualitative ranking | 1 | 0 | 2 | 2 | 2 | 2 | 2 |

We observe first that when the PEEK molten filament enter in contact with the PGA film ($T_m$=220° C.) and the PA 66/6AlSNa 95/5 film ($T_m$=253° C.), it melts the PGA which makes it not suitable as support material for the printing of PEEK unlike the PA 66/6AlSNa 95/5 which has a higher melting point. It appears clearly that the melting point of the support material needs to be higher than 250° C.

As expected, the PPS ($T_m$=280° C.), having a higher melting point than the PA 66/6AlSNa or PA 66 ($T_m$=260° C.), can be printed to with the PEEK hot filament without causing any melting or deformation of the surface. Unexpectedly, the adhesion of PEEK to the PPS film or plaque is so strong that it is impossible to remove the PEEK from the PPS film or plaque without breaking the PPS film or plaque and having a piece of PPS stuck to the PEEK.

Surprisingly, all of the polyamides with various melting point all above 250° C. like PA 66, PPA, PA 66/6AlSNa and PA 9T exhibit a good adhesion to PEEK during the printing process but can be detached from the PEEK more easily than PPS after cooling, provided that their water absorption at 23° C. is of at least 2% wt.

Moreover, the polyamides having higher moisture absorption showed an interesting behaviour after exposure to water as they detached more easily than the polyamides having a lower moisture absorption (PA 9T).

Preparative Example 8: Synthesis of Hydrophilic High Melting Temperature polyamide from terephthalic acid and 2,2'-(ethylenedioxy)bis(ethylamine)

In a reactor equipped with a stirrer, a pressure released valve and a condenser were introduced 9 g (0.054 mol) of terephthalic acid, 8 g (0.054 mol) of 2,2'-(ethylenedioxy)bis (ethylamine), 0.0052 g $H_3PO_3$ and 11 g of de-ionized water. The reactor was sealed, the pressure release valve was set to 20 bar, and the reaction mixture was heated to 335° C. within 1 hour. The reaction mixture was kept at 335° C. for 15 min and then cooled down to 200° C. within 1 hour and then to room temperature. After releasing the pressure from the reactor, the reactor was opened and the solid polymer was removed and analysed by DSC: the melting point was found to be equal to 256° C. and the melting enthalpy was found to be 29 J/g. The polymer was placed in a 50/50 wt/wt mixture water/ethanol at 90° C. at atmospheric pressure and was found to undergo at least partial dissolution after 3 hours exposure (the aqueous alcoholic solution was cloudy). Given its high melting point and its dissolution in aqueous alcoholic, this polyamide is particularly suitable for being used as polyamide (A) in the support material of the present invention. The water solubility is particularly interesting for the building of parts having complex geometry and/or undercut, so that the support material cannot be removed but by dissolution.

Preparative Example 9: Synthesis of Hydrophilic High Melting Temperature polyamide from 1,4-cyclohexandicarboxylic acid and 2,2'-(ethylenedioxy)bis(ethylamine)

In a reactor equipped with a stirrer and a condenser were introduced 9.08 g (0.053 mol) of 1,4-cyclohexane dicarboxylic acid, 7.86 g (0.053 mol) of 2,2'-(ethylenedioxy)bis (ethylamine), 0.0052 g $H_3PO_3$ and 11 g of dionized water. The reactor was sealed, the pressure release valve was set to 20 bar and the reaction mixture was heated to 335° C. within 1 hour. The reaction mixture was kept at 335° C. for 15 min and then cooled down to 200° C. within 1 hour and then to room temperature. After releasing the pressure from the reactor, the reactor was opened and the solid polymer was recovered and analysed by DSC: the melting point was found to be equal to 302° C. and the melting enthalpy was found to be 20 J/g. The polymer was placed in a 50/50 wt/wt mixture water/ethanol at 90° C. at atmospheric pressure and was totally dissolved after only 2 hour exposure (the aqueous alcoholic solution was cloudy). Given its high melting point and its dissolution in aqueous alcoholic, this polyamide is particularly suitable for being used as polyamide (A) in the support material of the present invention. The water solubility is particularly interesting for the building of parts having complex geometry and/or undercut, so that the support material cannot be removed but by dissolution.

The invention claimed is:

1. A method for making a three-dimensional object with an additive manufacturing system, the method comprising:
   printing layers of a support structure from a support material, the support material comprising more than 50% wt. of a semi-crystalline polyamide (A) having a melting point, as determined according to ASTM D3418, of at least 250° C. and possessing a water uptake at saturation, by immersion in water at 23° C., of at least 5 wt. %,
   printing layers of the three-dimensional object from a part material in coordination with the printing of the layers of the support structure, wherein at least a portion of the printed layers of the support structure support the printed layers of the three-dimensional object, and
   removing at least a portion of the support structure from the three-dimensional object to obtain the three-dimensional object,
   wherein the part material is selected from the group consisting of polysulfones, polyethersulfones, polyphenylsulfones, polyaryletherketones, polyetherimides, polyamideimides, polyphenylenesulfides, polyphenylenes, liquid crystal polymers, polycarbonates, aromatic polyamides, and semi-aromatic polyamides;
   wherein the support material comprises: at least one water-soluble polymeric additive different from polyamide (A), which is selected from the group consisting of polyethyleneglycol (PEG) polymers; polyvinylpyrrolidone (PVP) polymers; polymethylenenaphthalene sulfonates polymers; styrene sultanate polymers having —$SO_3Xa$ groups, with Xa being H or a metal; sulfonated sulfone polymers having —$SO_3Xa$ groups, with Xa being H or a metal; polysuccinimides and salts; polyaspartic acids and salts; poly(meth)acrylic acids and salts; polyvinyl sulfonic acids and salts; and polyvinylalcohols.

2. The method of claim 1, wherein the semi-crystalline polyamide (A) comprises formula:

  (I),

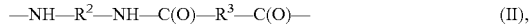  (II), or both formula (I) and (II),
wherein $R^1$, $R^2$, $R^3$, equal to or different from each other, are divalent hydrocarbon chains, and may be aliphatic, alicyclic, cycloaliphatic, aromatic or combinations thereof, wherein $R^1$, $R^2$, $R^3$ may contain one or more than one heteroatom selected from the group consisting of O, N, S, P, wherein the recurring units (I) and (II) of the semi-crystalline polyamide (A) comprise a number of carbon atoms in groups $R^1$, or $R^2$ and $R^3$ per amide group (—C(O)NH—) of less than 8.

3. The method of claim 1, wherein the semi-crystalline polyamide (A) is a condensation product of at least one mixture selected from:
mixtures (M1) comprising at least one diacid (DA), or derivatives thereof, and at least one diamine (NN), or derivatives thereof;
mixtures (M2) comprising at least one lactam (L);
mixtures (M3) comprising at least one aminocarboxylic acid (AN); and combinations thereof.

4. The method of claim 3, wherein the diacid (DA) comprises at least one diacid comprising ionisable groups (IDA); and/or wherein the diacid (DA) includes at least one of 4-hydroxyisophthalic acid, 5-hydroxyisophthalic acid, 2-hydroxyterephthalic acid, 2,5-dihydroxyterephthalic acid, 4,6-dihydroxyisophthalic acid, 5-sulfoisophthalic acid and salts thereof, and 2-sulfoterephthalic acid and salts thereof.

5. The method of claim 3, wherein the at least one diamine (NN) comprises ethereal bonds (NNE).

6. The method of claim 3, wherein the semi-crystalline polyamide (A) is a polycondensation of (a) mixtures (M1) selected from the group consisting of:
(b) mixtures of 1,6-diaminohexane and adipic acid;
(c) mixtures of 1,4-diaminobutane and adipic acid;
(d) mixtures of 1,5-diaminopentane and adipic acid;
(e) mixtures of adipic acid, terephthalic acid, and 1,6-diaminohexane, wherein the amount of the terephthalic acid is at least 25% moles, with respect to the moles of the diacid (DA);
(f) mixtures of terephthalic acid, isophthalic acid, and 1,6-diaminohexane, wherein the amount of the terephthalic acid is at least 55% moles, with respect to the moles of the diacid (DA);
(g) mixtures of adipic acid, terephthalic acid, isophthalic acid, and 1,6-diaminohexane, wherein the amount of the terephthalic acid is at least 55% moles, with respect to the moles of the diacid (DA); least one diamine comprising ethereal bonds (NNE), optionally in combination with one or more than one aliphatic diamines;
(h) mixtures of adipic acid optionally further comprising minor amounts of isophthalic acid, terephthalic acid, or mixtures thereof with respect to the diacid (DA), and at least one diamine comprising ethereal bonds (NNE), optionally in combination with one or more than one aliphatic diamines;
(i) mixtures of adipic acid and at least one diacid comprising ionisable groups (IDA), the diacid comprising ionisable groups (IDA) representing at most 15% moles of the total diacid (DA) moles, and 1,6-diaminohexane;
(j) mixtures of terephthalic acid and at least one diacid comprising ionisable groups (IDA), the diacid comprising ionisable groups (IDA) representing at most 15% of the total diacid (DA) moles, and 1,6-diaminohexane;
(k) mixtures of 1,4-cyclohexanedicarboxylic acid and at least one diamine comprising ethereal bonds (NNE), optionally in combination with one or more than one aliphatic diamines; and
(l) mixtures of 1,4-cyclohexanedicarboxylic acid and at least one diacid comprising ionisable groups (IDA), the diacid comprising ionisable groups (IDA) representing at most 15% moles of the total diacid (DA) moles, and at least one diamine comprising ethereal bonds (NNE), optionally in combination with one or more than one aliphatic diamines.

7. The method of claim 1, wherein the support material comprises a moisture content of less than 0.5% wt., with respect to the total weight of the support material.

8. The method of claim 1, wherein the method comprises making the three-dimensional object with an extrusion-based additive manufacturing system.

9. The method of claim 8, wherein the method comprises printing layers of a sacrificial support structure from the provided support material, the method comprising:
feeding the support material to a discharge head member having a throughbore ending with a discharge tip, and a circumferential heater to melt the material in the throughbore; compressing the support material with a piston and/or the unmelted filament in said throughbore, while simultaneously melting the support material in the discharge head member, so as to extrude a ribbon of support material from the discharge tip;
ensuring relative movement in x and y directions of the discharge tip and of a receiving platform while discharging support material on said receiving platform to form the cross sectional shape of the sacrificial support structure; and
ensuring relative movement in the z direction of the discharge tip and the receiving platform while discharging support material on said receiving platform to form the sacrificial support structure in elevation.

10. The method of claim 9, wherein the step of printing layers of the three-dimensional object from the part material in coordination with the printing of the layers of the support structure further comprises:
feeding the part material to a discharge head member having a throughbore ending with a discharge tip, and a circumferential heater to melt the material in the throughbore;
b') compressing the part material with a piston and/or the unmelted filament in said throughbore, while simultaneously melting the part material in the discharge head member, so as to extrude a ribbon of part material from the discharge tip;
c) ensuring relative movement in x and y directions of the discharge tip and the receiving platform bearing the sacrificial support structure, while discharging support material on said receiving platform and said sacrificial support structure to form the cross sectional shape of the three-dimensional object, and
d) ensuring relative movement in the z direction of the discharge tip and the receiving platform while discharging part material on said receiving platform and said sacrificial support structure, to form the three-dimensional object in elevation.

11. The method of claim 1, wherein the step of removing at least a portion of the support structure from the assembly so as to obtain the three-dimensional object comprises exposing the assembly to water vapour and/or to water.

12. The method of claim 11, wherein step comprises exposing the assembly to air possessing a relative humidity (RH) of at least 70% at the temperature of exposure or comprises contacting, immersing, or both containing and immersing the assembly with, in, or both with and in liquid water.

13. The method of claim 1, wherein the support structure is removed from the assembly and wherein the support structure is detached from the three-dimensional object and removed in its solid form or by at least partial solubilization.

14. The method of claim 4, wherein the ionisable groups (IDA) are selected from phenolic hydroxylic groups, sulfonic groups, phosphonic groups, and onium groups.

15. The method of claim 5, wherein the at least one diamine (NN) comprises moieties of formula: $-(OCH_2-CHR^J)_n-$, with $R^J$ being H or a $C_1$-$C_3$ alkyl group, and n being an integer of 1 to 15, and diamines comprising moieties of formula: $-O-C(R'^J)(R''^J)-O-$, with $R'^J$ and $R''^J$, equal to or different from each other and at each occurrence, being H or a $C_1$-$C_3$ alkyl group.

16. A method for making a three-dimensional object with an additive manufacturing system, the method comprising:
   printing layers of a support structure from a support material, the support material comprising more than 50% wt. of a semi-crystalline polyamide (A) having a melting point, as determined according to ASTM D3418, of at least 250° C. and possessing a water uptake at saturation, by immersion in water at 23° C., of at least 5 wt. %,
   printing layers of the three-dimensional object from a part material in coordination with the printing of the layers of the support structure, wherein at least a portion the printed layers of the support structure support the printed layers of the three-dimensional object, and
   removing at least a portion of the support structure from the three-dimensional object to obtain the three-dimensional object,
   wherein the support material comprises at least one water-soluble polymeric additive different from polyamide (A), which is selected from the group consisting of polyethyleneglycol (PEG) polymers; polyvinylpyrrolidone (PVP) polymers; polymethylenenaphthalene sultanates polymers; styrene sulfonate polymers having $-SO_3X_a$ groups, with $X_a$ being H or a metal; sulfonated sulfone polymers having $-SO_3X_a$ groups, with $X_a$ being H or a metal; polysuccinimides and salts; polyaspartic acids and salts; poly(meth)acrylic acids and salts; polyvinyl sulfonic acids and salts; and polyvinylalcohols.

17. The method of claim 16, wherein the semi-crystalline polyamide (A) is a polycondensation of (a) mixtures (M1) selected from the group consisting of:
   (b) mixtures of 1,6-diaminohexane and adipic acid;
   (c) mixtures of 1,4-diaminobutane and adipic acid;
   (d) mixtures of 1,5-diaminopentane and adipic acid;
   (e) mixtures of adipic acid, terephthalic acid, and 1,6-diaminohexane, wherein the amount of the terephthalic acid is at least 25% moles, with respect to the moles of the diacid (DA);
   (f) mixtures of terephthalic acid, isophthalic acid, and 1,6-diaminohexane, wherein the amount of the terephthalic acid is at least 55% moles, with respect to the moles of the diacid (DA);
   (g) mixtures of adipic acid, terephthalic acid, isophthalic acid, and 1,6-diaminohexane, wherein the amount of the terephthalic acid is at least 55% moles, with respect to the moles of the diacid (DA); least one diamine comprising ethereal bonds (NNE), optionally in combination with one or more than one aliphatic diamines;
   (h) mixtures of adipic acid optionally further comprising minor amounts of isophthalic acid, terephthalic acid, or mixtures thereof with respect to the diacid (DA), and at least one diamine comprising ethereal bonds (NNE), optionally in combination with one or more than one aliphatic diamines;
   (i) mixtures of adipic acid and at least one diacid comprising ionisable groups (IDA), the diacid comprising ionisable groups (IDA) representing at most 15% moles of the total diacid (DA) moles, and 1,6-diaminohexane;
   (j) mixtures of terephthalic acid and at least one diacid comprising ionisable groups (IDA), the diacid comprising ionisable groups (IDA) representing at most 15% of the total diacid (DA) moles, and 1,6-diaminohexane;
   (k) mixtures of 1,4-cyclohexanedicarboxylic acid and at least one diamine comprising ethereal bonds (NNE), optionally in combination with one or more than one aliphatic diamines; and
   (l) mixtures of 1,4-cyclohexanedicarboxylic acid and at least one diacid comprising ionisable groups (IDA), the diacid comprising ionisable groups (IDA) representing at most 15% moles of the total diacid (DA) moles, and at least one diamine comprising ethereal bonds (NNE), optionally in combination with one or more than one aliphatic diamines.

* * * * *